US007787389B2

(12) United States Patent
Chen et al.

(10) Patent No.: US 7,787,389 B2
(45) Date of Patent: Aug. 31, 2010

(54) METHOD AND SYSTEM FOR UTILIZATION OF AN OUTER DECODER IN A BROADCAST SERVICES COMMUNICATION SYSTEM

(75) Inventors: Tao Chen, San Diego, CA (US); Jack K. Wolf, La Jolla, CA (US); Joseph P. Odenwalder, Santa Fe, CA (US); Edward G. Tiedemann, Jr., Concord, MA (US); Brian K. Butler, La Jolla, CA (US); Yongbin Wei, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 2720 days.

(21) Appl. No.: 09/933,912

(22) Filed: Aug. 20, 2001

(65) Prior Publication Data

US 2003/0035389 A1     Feb. 20, 2003

(51) Int. Cl.
*G01R 31/08* (2006.01)
*G06F 11/30* (2006.01)
(52) U.S. Cl. .................................. 370/252; 714/746
(58) Field of Classification Search ................. 370/328, 370/331, 335, 389, 342, 252, 338; 714/746, 714/753, 755; 455/436–437, 442–443, 440
See application file for complete search history.

(56) References Cited

U.S. PATENT DOCUMENTS

| 4,901,307 A | 2/1990 | Gilhousen et al. |
| 5,103,459 A | 4/1992 | Gilhousen et al. |
| 5,504,773 A | 4/1996 | Padovani et al. |
| 5,537,410 A * | 7/1996 | Li .............................. 370/465 |
| 5,659,877 A | 8/1997 | Enomoto et al. |
| 5,742,619 A * | 4/1998 | Hassan ........................ 714/755 |
| 5,751,725 A | 5/1998 | Chen |
| 5,774,496 A | 6/1998 | Butler et al. |

(Continued)

FOREIGN PATENT DOCUMENTS

EP     0712219     5/1996

(Continued)

OTHER PUBLICATIONS

TIA/EIA-95 Mobile Station-Base Station Compatibility Standard for Dual-Mode Wide-Sand Spread Spectrum Cellular System, Jul. 1993 (IS-95).

(Continued)

*Primary Examiner*—Nittaya Juntima
(74) *Attorney, Agent, or Firm*—Larry J. Moskowitz

(57) ABSTRACT

A Method and System for Utilization of an Outer Decoder in a Broadcast Services Communication System is described. An outer decoder and an inner decoder encode a block of information to be transmitted, to improve protection by adding redundancy. The redundancy permits decoding of the information from less than a complete encoded block of information. Consequently, the receiving station determines when sufficient amount of information for successful decoding has been received, and utilizes the time remaining before the next block of information arrives to perform other activities, e.g., hard handoff on a broadcast channel, inter-frequency hard handoff, and other activities. Alternatively, the receiving station can cease reception, thus decrease power consumption. Furthermore, part of the information block may be utilized for transmission of signaling information.

72 Claims, 6 Drawing Sheets

REED-SOLOMAN OUTER CODE BLOCK DIAGRAM

U.S. PATENT DOCUMENTS

| | | | |
|---|---|---|---|
| 5,878,098 A | | 3/1999 | Wang et al. |
| 5,896,373 A | * | 4/1999 | Mitts et al. ............... 370/331 |
| 5,999,816 A | | 12/1999 | Tiedemann, Jr. et al. |
| 6,002,678 A | | 12/1999 | Jayapalan et al. |
| 6,012,159 A | * | 1/2000 | Fischer et al. ............... 714/755 |
| 6,134,440 A | | 10/2000 | Black |
| 6,195,342 B1 | * | 2/2001 | Rohani ............... 370/331 |
| 6,247,150 B1 | * | 6/2001 | Niemela ............... 714/701 |
| 6,256,501 B1 | * | 7/2001 | Tokuyama et al. ......... 455/442 |
| 6,574,211 B2 | | 6/2003 | Padovani et al. |
| 6,622,023 B2 | * | 9/2003 | Chheda ............... 455/522 |
| 6,731,936 B2 | | 5/2004 | Chen et al. |
| 6,741,577 B1 | * | 5/2004 | Henon ............... 370/331 |
| 6,980,820 B2 | | 12/2005 | Sinnarajah et al. |
| 2001/0012279 A1 | * | 8/2001 | Haumont et al. ............ 370/331 |

FOREIGN PATENT DOCUMENTS

| | | |
|---|---|---|
| EP | 0928116 | 7/1999 |
| EP | 1098540 | 2/2001 |
| GB | 2116403 | 9/1983 |
| JP | 10-107779 | 4/1998 |
| WO | 9927674 | 6/1999 |

OTHER PUBLICATIONS

"TIA/EIA/IS-856, 3GPP2 C.S0024,Version 2.0, Oct. 27, 2000 cdma2000 High Rate Packet Data Air InterfaceSpecification (IS-856)".

Physical Layer Standard for cdma2000 Spread Spectrum Systems, 3GPP2 C S0002-0 Version 1,0, Jul. 1999 (TR-45.5).

3G TS 25.211 V3.2.0 (2000-03), 3rd Generation Partnership Project; Technical Specification Group Radio Access Network; Physical channels and mapping of transport channels onto physical channels (FDD) (Release 1999).

3G TS 25.212 V3.2.0 (2000-03) 3rd Generation Partnership Project; Technical Specification Group Radio Access Network; Multiplexing and channel coding (FDD) (Release 1999).

3G TS 25.213 V3.2.0 (2000-03), 3rd Generation Partnership Project-;Technical Specification Group Radio Access Network: Spreading and modulation (FDD) (Release 1999).

3G TS 25.214 V3.2.0 (2000-03), 3rd Generation Partnership Project; Technical Specification Group Radio Access Network; Physical layer procedures (FDD) (Release 1999).

International Search Report-PCT/US02/026037, International Search Authority-European Patent Office, Apr. 22, 2003.

European Search Report-EP09172623, Searching Authority-Munich, Date of Completion Nov. 9, 2009.

* cited by examiner

METHOD AND SYSTEM FOR UTILIZATION OF AN OUTER DECODER IN A BROADCAST SERVICES COMMUNICATION SYSTEM

BACKGROUND

1. Field

The present invention relates to broadcast communications, otherwise known as point-to-multipoint communications, in a wireline or a wireless communication system. More particularly, the present invention relates to a system and method for utilization of an outer decoder in such a broadcast communication system.

2. Background

Communication systems have been developed to allow transmission of information signals from an origination station to a physically distinct destination station. In transmitting information signal from the origination station over a communication channel, the information signal is first converted into a form suitable for efficient transmission over the communication channel. Conversion, or modulation, of the information signal involves varying a parameter of a carrier wave in accordance with the information signal in such a way that the spectrum of the resulting modulated carrier is confined within the communication channel bandwidth. At the destination station the original information signal is replicated from the modulated carrier wave received over the communication channel. Such a replication is generally achieved by using an inverse of the modulation process employed by the origination station.

Modulation also facilitates multiple-access, i.e., simultaneous transmission and/or reception, of several signals over a common communication channel. Multiple-access communication systems often include a plurality of subscriber units requiring intermittent service of relatively short duration rather than continuous access to the common communication channel. Several multiple-access techniques are known in the art, such as time division multiple-access (TDMA), frequency division multiple-access (FDMA), and amplitude modulation multiple-access (AM). Another type of a multiple-access technique is a code division multiple-access (CDMA) spread spectrum system that conforms to the "TIA/EIA/IS-95 Mobile Station-Base Station Compatibility Standard for Dual-Mode Wide-Band Spread Spectrum Cellular System," hereinafter referred to as the IS-95 standard. The use of CDMA techniques in a multiple-access communication system is disclosed in U.S. Pat. No. 4,901,307, entitled "SPREAD SPECTRUM MULTIPLE-ACCESS COMMUNICATION SYSTEM USING SATELLITE OR TERRESTRIAL REPEATERS," and U.S. Pat. No. 5,103,459, entitled "SYSTEM AND METHOD FOR GENERATING WAVEFORMS IN A CDMA CELLULAR TELEPHONE SYSTEM," both assigned to the assignee of the present invention.

A multiple-access communication system may be a wireless or wire-line and may carry voice and/or data. An example of a communication system carrying both voice and data is a system in accordance with the IS-95 standard, which specifies transmitting voice and data over the communication channel. A method for transmitting data in code channel frames of fixed size is described in detail in U.S. Pat. No. 5,504,773, entitled "METHOD AND APPARATUS FOR THE FORMATTING OF DATA FOR TRANSMISSION", assigned to the assignee of the present invention. In accordance with the IS-95 standard, the data or voice is partitioned into code channel frames that are 20 milliseconds wide with data rates as high as 14.4 Kbps. Additional examples of a communication systems carrying both voice and data comprise communication systems conforming to the "3rd Generation Partnership Project" (3GPP), embodied in a set of documents including Document Nos. 3G TS 25.211, 3G TS 25.212, 3G TS 25.213, and 3G TS 25.214 (the W-CDMA standard), or "TR-45.5 Physical Layer Standard for cdma2000 Spread Spectrum Systems" (the IS-2000 standard).

An example of a data only communication system is a high data rate (HDR) communication system that conforms to the TIA/EIA/IS-856 industry standard, hereinafter referred to as the IS-856 standard. This HDR system is based on a communication system disclosed in co-pending application Ser. No. 08/963,386, entitled "METHOD AND APPARATUS FOR HIGH RATE PACKET DATA TRANSMISSION," filed Nov. 3, 1997, and assigned to the assignee of the present invention. The HDR communication system defines a set of data rates, ranging from 38.4 kbps to 2.4 Mbps, at which an access point (AP) may send data to a subscriber station (access terminal, AT). Because the AP is analogous to a base station, the terminology with respect to cells and sectors is the same as with respect to voice systems.

In a multiple-access communication system, communications between users are conducted through one or more base stations. A first user on one subscriber station communicates to a second user on a second subscriber station by transmitting data on a reverse link to a base station. The base station receives the data and can route the data to another base station. The data is transmitted on a forward link of the same base station, or the other base station, to the second subscriber station. The forward link refers to transmission from a base station to a subscriber station and the reverse link refers to transmission from a subscriber station to a base station. Likewise, the communication can be conducted between a first user on one subscriber station and a second user on a landline station. A base station receives the data from the user on a reverse link, and routes the data through a public switched telephone network (PSTN) to the second user. In many communication systems, e.g., IS-95, W-CDMA, IS-2000, the forward link and the reverse link are allocated separate frequencies.

The above described wireless communication service is an example of a point-to-point communication service. In contrast, broadcast services provide point-to-multipoint communication service. The basic model of a broadcast system consists of a broadcast net of users served by one or more central stations, which transmit information with a certain contents, e.g., news, movies, sports events and the like to the users. Each broadcast net user's subscriber station monitors a common broadcast forward link signal. Because the central station fixedly determines the content, the users are generally not communicating back. Examples of common usage of broadcast services communication systems are TV broadcast, radio broadcast, and the like. Such communication systems are generally highly specialized purpose-build communication systems. With the recent, advancements in wireless cellular telephone systems there has been an interest of utilizing the existing infrastructure of the—mainly point-to-point cellular telephone systems for broadcast services. (As used herein, the term "cellular" systems encompasses communication systems utilizing both cellular and PCS frequencies.)

The information signal to be exchanged among the terminals in a communication system is often organized into a plurality of packets. For the purposes of this description, a packet is a group of bytes, including data (payload) and control elements, arranged into a specific format. The control elements comprise, e.g., a preamble and a quality metric. The quality metric comprises, e.g., cyclical redundancy check (CRC), parity bit(s), and other types of metric known to one skilled in the art. The packets are usually formatted into a message in accordance with a communication channel structure. The message, appropriately modulated, traveling between the origination terminal and the destination terminal, is affected by characteristics of the communication channel, e.g., signal-to-noise ratio, fading, time variance, and other such characteristics. Such characteristics affect the modulated signal differently in different communication channels. Consequently, transmission of a modulated signal over a wireless communication channel requires different considerations than transmission of a modulated signal over a wire-like communication channel, e.g., a coaxial cable or an optical cable. In addition to selecting modulation appropriate for a particular communication channel, other methods for protecting the information signal have been devised. Such methods comprise, e.g., encoding, symbol repetition, interleaving, and other methods know to one of ordinary skill in the art. However, these methods increase overhead. Therefore, an engineering compromise between reliability of message delivery and the amount of overhead must be made. Even with the above-discussed protection of information, the conditions of the communication channel can degrade to the point at which the destination station possibly cannot decode (erases) some of the packets comprising the message. In data-only communications systems, the cure is to re-transmit the non-decoded packets using an Automatic Retransmission request (ARQ) made by the destination station to the origination station. However, as discussed, the subscribers do not communicate back to the base station. Furthermore, even if the subscribers were allowed to communicate ARQ, this communication might overload the communication system. Consequently, other means of information protection are desirable.

Based on the foregoing, there is a need in the art for a method and a system and method for utilization of an outer decoder in such a broadcast communication system.

SUMMARY

Embodiments disclosed herein address the above stated needs by providing a method and a system executing the method to utilize an outer decoder. The use of the outer decoder further facilitates reducing power consumption of a subscriber station by determining a number of frames that must be received correctly; and terminating reception of the frames when said determined number of frames was received correctly.

In another aspect of the invention, the use of the outer decoder further facilitates improved method for hard handoff on a common broadcast channel by receiving at a subscriber station frames transmitted on the common broadcast channel from a first sector; determining at the subscriber station a need for handoff; identifying at the subscriber station at least one sector belonging to a soft handoff group different from a soft handoff group including the first sector; determining a number of frames from a current buffer that must be received correctly; terminating reception of the frames when said determined number of frames were received correctly; and beginning reception of frames from the identified at least one sector.

In another aspect of the invention, the use of the outer decoder further facilitates improved method for inter-frequency hard handoff by receiving at a subscriber station service on a channel from a sector in the origination system; determining at the subscriber station a need for handoff; identifying at the subscriber station a destination system; determining a number of frames from a current buffer that must be received correctly; terminating reception of the frames when said determined number of frames were received correctly; tuning to a frequency of the destination system; and receiving service on a channel from at least one sector if the at least one sector of the destination system is acquired at the subscriber station.

In another aspect of the invention, the use of the outer decoder further facilitates utilizing a common broadcast channel for signaling by replacing part of a content of a parity portion of a transmitting buffer with a signaling information; and transmitting a content of the transmitting buffer at a determined time on the common broadcast channel.

DETAILED DESCRIPTION

Definitions

Figure 1:
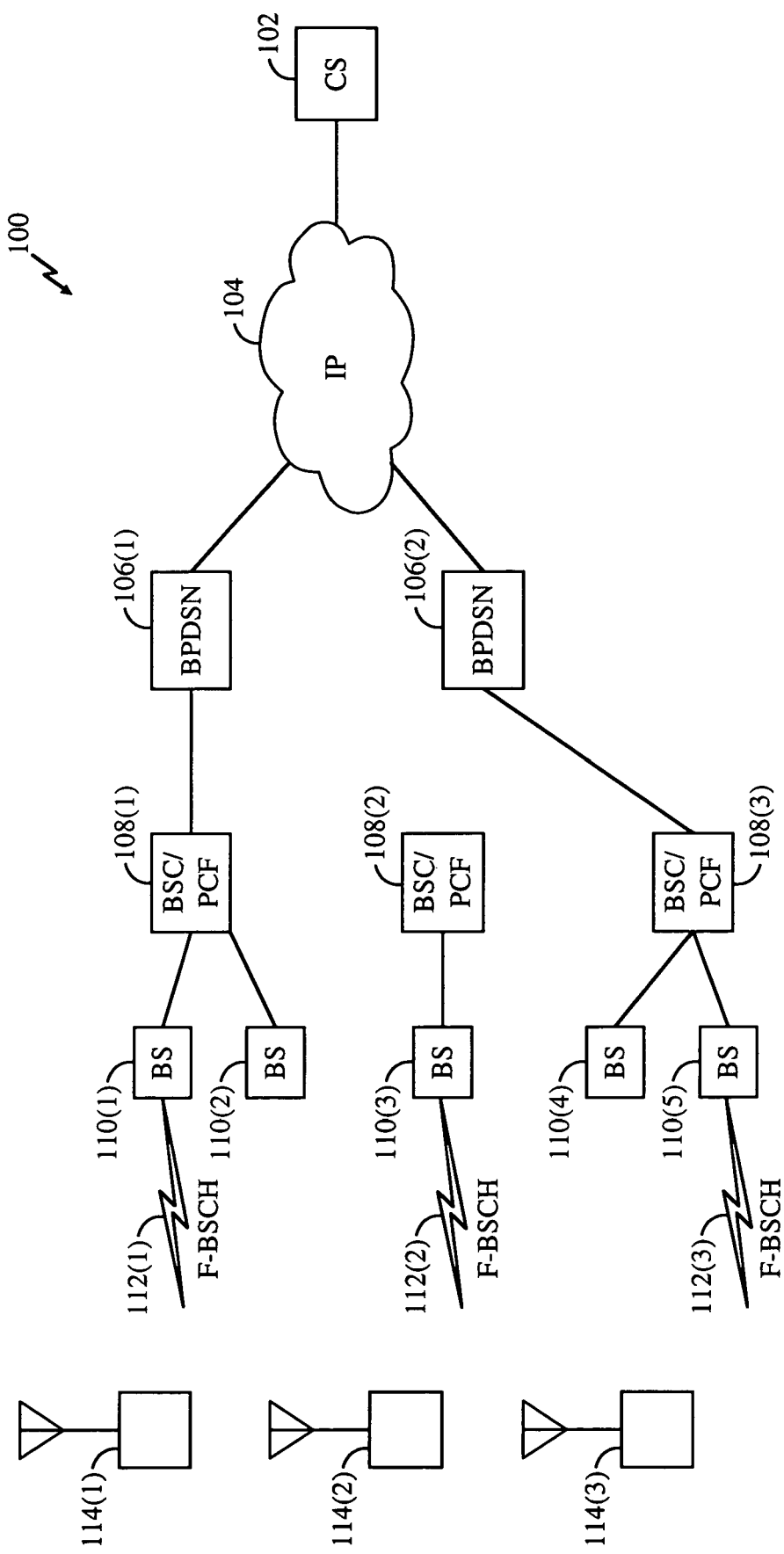
FIG. 1 illustrates conceptual block diagram of a High-Speed Broadcast Service communication system.

The word "exemplary" is used herein to mean "serving as an example, instance, or illustration." Any embodiment described herein as "exemplary" is not necessarily to be construed as preferred or advantageous over other embodiments.

The terms point-to-point communication is used herein to mean a communication between two subscriber stations over a dedicated communication channel.

The terms broadcast communication or point-to-multipoint communication are used herein to mean a communication wherein a plurality of subscriber stations are receiving communication from one source.

The term packet is used herein to mean a group of bits, including data (payload) and control elements, arranged into a specific format. The control elements comprise, e.g., a preamble, a quality metric, and others known to one skilled in the art. Quality metric comprises, e.g., a cyclical redundancy check (CRC), a parity bit, and others known to one skilled in the art.

The term access network is used herein to mean a collection of base stations (BS) and one or more base stations' controllers. The access network transports data packets between multiple subscriber stations. The access network may be further connected to additional networks outside the access network, such as a corporate intranet or the Internet, and may transport data packets between each access terminal and such outside networks.

The term base station is used herein to mean the hardware with which subscriber stations communicate. Cell refers to the hardware or a geographic coverage area, depending on the context in which the term is used. A sector is a partition of a cell. Because a sector has the attributes of a cell, the teachings described in terms of cells are readily extended to sectors.

The term subscriber station is used herein to mean the hardware with which an access network communicates. A subscriber station may be mobile or stationary. A subscriber station may be any data device that communicates through a wireless channel or through a wired channel, for example using fiber optic or coaxial cables. A subscriber station may further be any of a number of types of devices including but not limited to PC card, compact flash, external or internal modem, or wireless or wireline phone. A subscriber station that is in the process of establishing an active traffic channel connection with a base station is said to be in a connection setup state. A subscriber station that has established an active traffic channel connection with a base station is called an active subscriber station, and is said to be in a traffic state.

The term physical channel is used herein to mean a communication route over which a signal propagates described in terms of modulation characteristics and coding.

The term logical channel is used herein to mean a communication route within the protocol layers of either the base station or the subscriber station.

The term communication channel/link is used herein to mean a physical channel or a logical channel in accordance with the context.

The term reverse channel/link is used herein to mean a communication channel/link through which the subscriber station sends signals to the base station.

A forward channel/link is used herein to mean a communication channel/link through which a base station sends signals to a subscriber station.

The term soft hand-off is used herein to mean a communication between a subscriber station and two or more sectors, wherein each sector belongs to a different cell. The reverse link communication is received by both sectors, and the forward link communication is simultaneously carried on the two or more sectors' forward links.

The term softer hand-off is used herein to mean a communication between a subscriber station and two or more sectors, wherein each sector belongs to the same cell. The reverse link communication is received by both sectors, and the forward link communication is simultaneously carried on one of the two or more sectors' forward links.

The term erasure is used herein to mean failure to recognize a message.

The term dedicated channel is used herein to mean a channel modulated by information specific to an individual subscriber station.

The term common channel is used herein to mean a channel modulated by information shared among all subscriber stations.

Description

As discussed, a basic model of a broadcast system comprises a broadcast net of users, served by one or more central stations, which transmit information with a certain contents, e.g., news, movies, sports events and the like to the users. Each broadcast net user's subscriber station monitors a common broadcast forward link signal. FIG. 1 illustrates conceptual block diagram of a communication system 100, capable of performing High-Speed Broadcast Service (HSBS) in accordance with embodiments of the present invention.

The broadcast content originates at a content server (CS) 102. The content server may be located within the carrier network (not shown) or outside Internet (IP) 104. The content is delivered in a form of packets to a broadcast packet data-serving node (BPDSN) 106. The term BPSDN is used because although the BPSDN may be physically co-located or be identical to the regular PDSN (not shown), the BPSDN may be logically different from a regular PDSN. The BPSDN 106 delivers the packets according to the packet's destination to a packet control function (PCF) 108. The PCF is a control entity controlling function of base stations 110 for the HSBS as a base station controller is for regular voice and data services. To illustrate the connection of the high level concept of the HSBS with the physical access network, FIG. 1 shows a PCF physically co-located or even identical, but logically different from a base station controller (BSC). One of ordinary skills in the art understands that this is for a pedagogical purposes only. The BSC/PCF 108 provides the packets to base stations 114.

Figure 2:
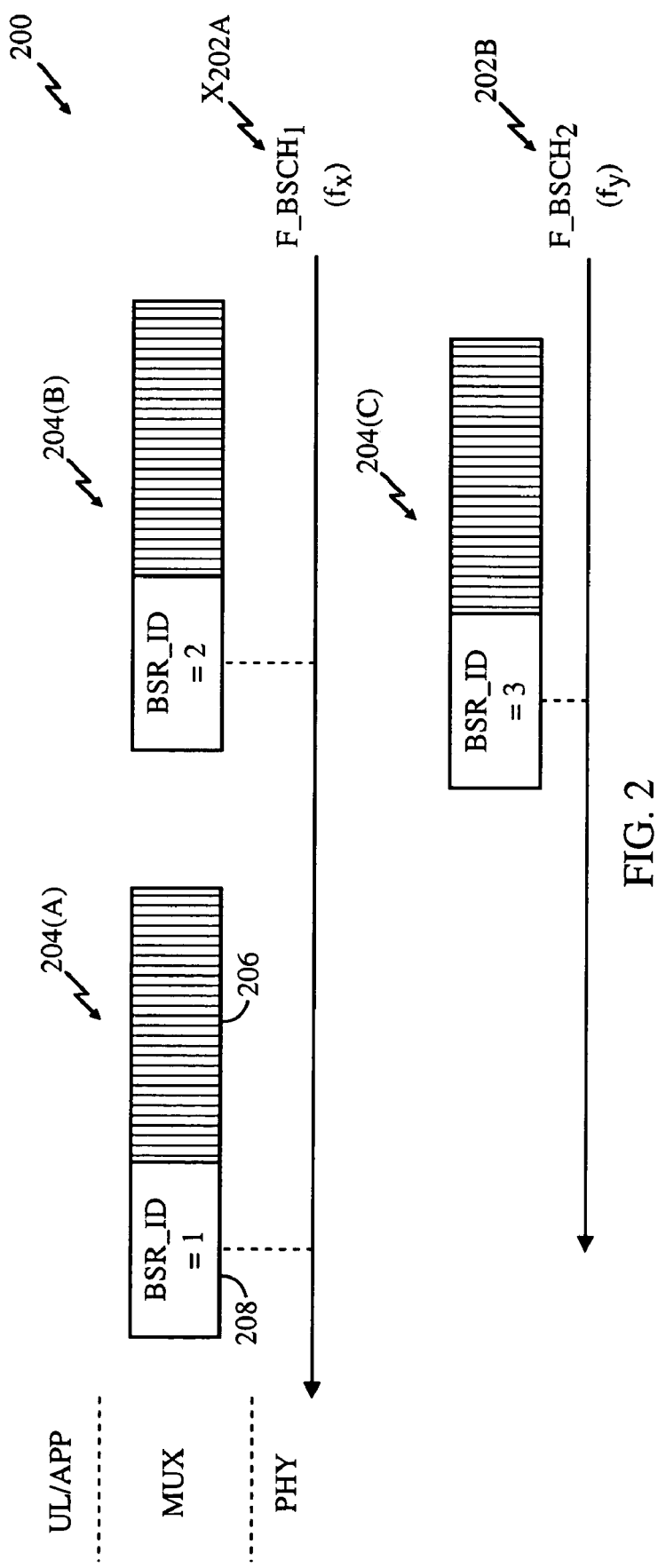
FIG. 2 illustrates a concept of physical and logical channels for the HSBS.

The communication system 100 enables High-Speed Broadcast Service (HSBS) by introducing a forward broadcast shared channel (F-BSCH) 112 capable of high data rates that can be received by a large number of subscriber stations 114. The term forward broadcast shared channel is used herein to mean a single forward link physical channel that carries broadcast traffic. A single F-BSCH can carry one or more HSBS channels multiplexed in a TDM fashion within the single F-BSCH. The term HSBS channel is used herein to mean a single logical HSBS broadcast session defined by the session's broadcast content. Each session is defined by a broadcast content that may change with time; for example, 7 am—News, 8 am—Weather, 9 am—Movies, etc. FIG. 2 illustrates the discussed concept of physical and logical channels for the HSBS.

As illustrated in FIG. 2, an HSBS is provided on two F-BSCHs 202, each of which is transmitted on a separate frequency fx, fy. Thus, for example, in the above-mentioned cdma2000 communication system such a physical channel can comprise e.g., a forward supplemental channel (F-SCH), forward broadcast control channel (F-BCCH), forward common control channel (F-CCCH), other common and dedicated channels and the channel's combination. The use of common and dedicated channels for information broadcast is disclosed in a provisional U.S. patent application Ser. No. 60/279,970, entitled "METHOD AND APPARATUS FOR GROUP CALLS USING DEDICATED AND COMMON CHANNELS IN WIRELESS NETWORKS", filed Mar. 28, 2001, and assigned to the assignee of the present invention. One of ordinary skills in the art understands that other communication systems utilize channels performing similar function, therefore, the teaching is applicable to other communication systems. The F-BSCHs 202 carry the broadcast traffic, which may comprise one or more broadcast sessions. The F-BSCHs 202b carries one HSBS channel 204c; two HSBS channels 204a, 204b are multiplexed onto the F-BCCH 202a. The content of an HSBS channel is formatted into packets comprising a payload 206 and a header 208.

One of ordinary skill in the art recognizes that the HSBS broadcast service deployment as illustrated in FIG. 2 is for pedagogical purposes only. Therefore, in a given sector, the HSBS broadcast service can be deployed in several manners in accordance with features supported by an implementation of a particular communication system. The implementation features include, e.g., the number of HSBS sessions supported, number of frequency assignments, number of broadcast physical channels supported, and other implementation features known to one skilled in the art. Thus, for example, more than two frequencies, and F-BSCHs may be deployed in a sector. Furthermore, more than two HSBS channels may be multiplexed onto one F-BSCH. Furthermore, a single HSBS channel can be multiplexed onto more than one broadcast channel within a sector, on different frequencies to serve the subscribers residing in those frequencies.

Figure 3:
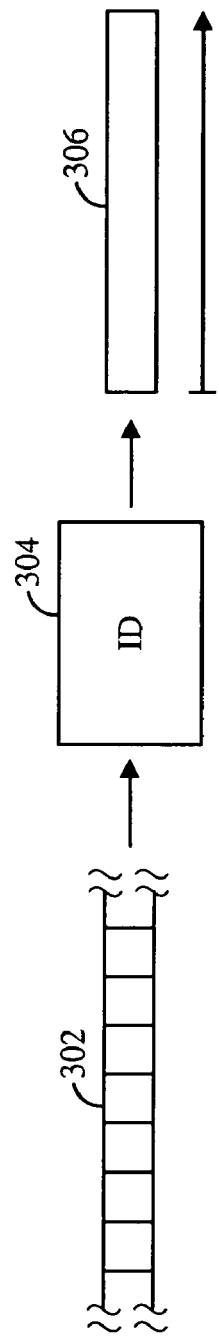
FIG. 3 illustrates a prior art encoding.

As discussed, communications systems often transmit information in frames or blocks, which are protected by encoding against adverse condition affecting a communication channel. Examples of such systems comprise cdma2000, WCDMA, UMTS. As illustrated in FIG. 3, the bit stream of information to be transmitted 302, originating at higher layers, is provided to an (inner) encoder 304 on a physical layer. The encoder accepts a block of bits of a length S. This block of S bits typically includes some overhead, e.g., tail bits for the inner encoder, a cyclic redundancy check (CRC) to assist the inner decoder at the receiving side ascertain success or failure of decoding help the inner decoder, and other overhead information known to one of ordinary skills in the art. The encoder then encodes the S bits with a selected code resulting in an encoded block of length P=S+R, where R denotes the number of redundant bits. One of ordinary skills in the art understands that although the embodiments are explained in terms of layering model, this is for pedagogical purposes, and the various illustrative logical blocks, modules, circuits, and algorithm steps described in connection with the physical layer are implemented as electronic hardware, computer software, or combinations of both. Thus, for example, the inner encoder 304 may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Figure 4:
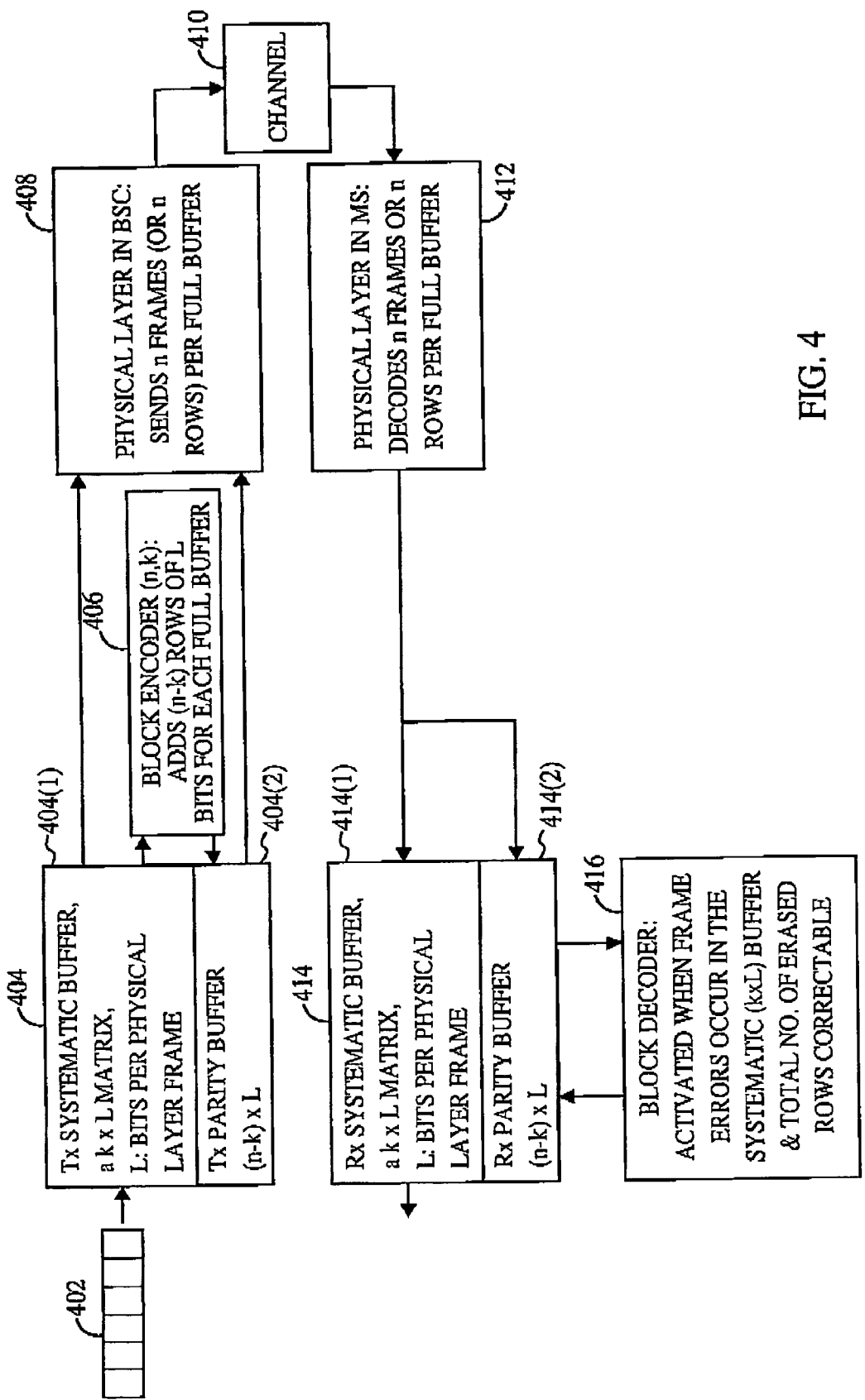
FIG. 4 illustrates physical layer processing in accordance with one embodiment of the invention.
Figure 5:
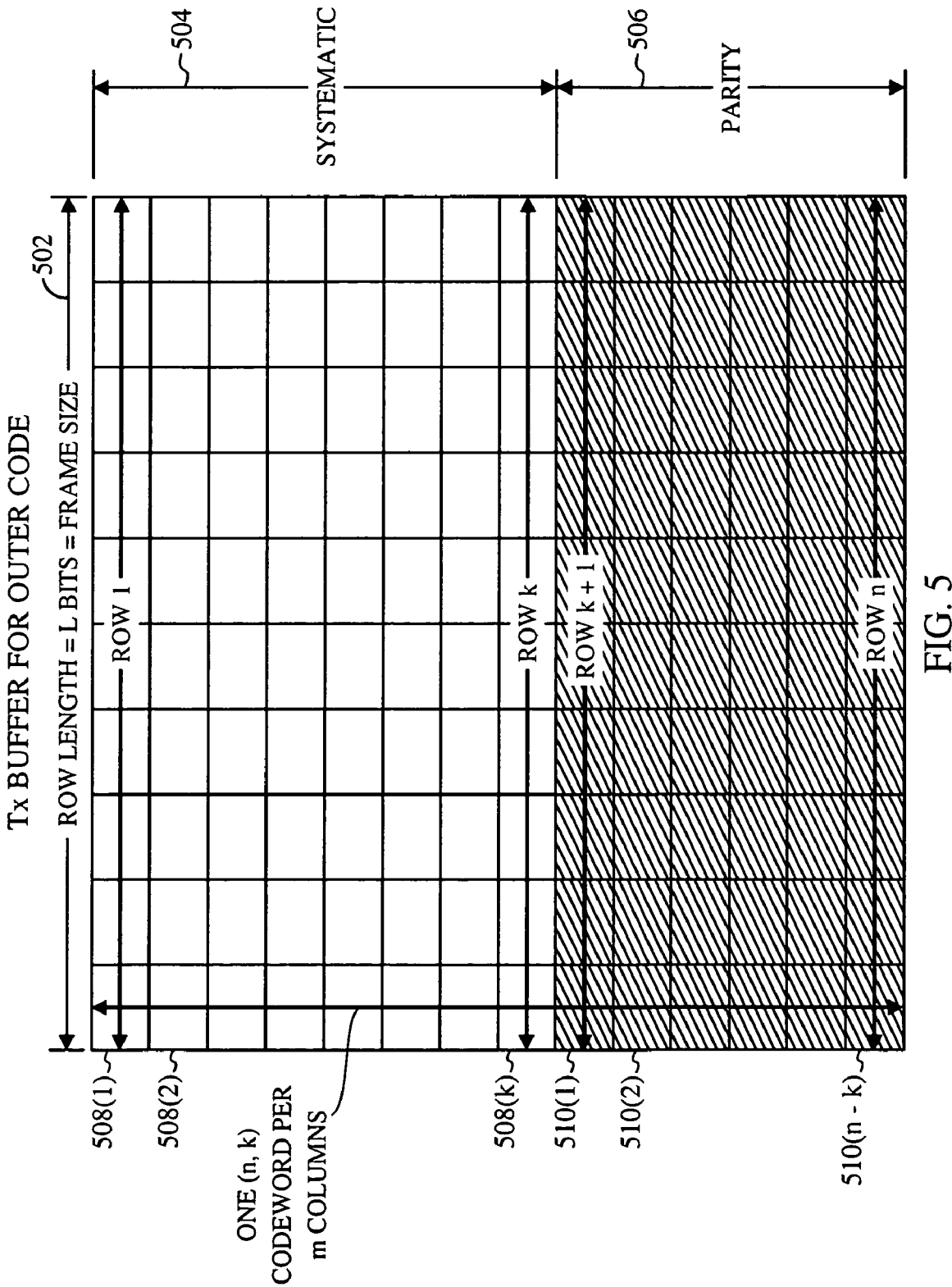
FIG. 5 illustrates a transmit buffer.

In accordance with one embodiment of the present invention, as illustrated in FIG. 4, the bit stream of information to be transmitted 402 is first encoded by an outer encoder 406 and the encoded stream is then provided into the inner encoder (not shown), residing on the physical layer 408. The bit stream of information to be transmitted 402, originating at higher layers, is provided to a transmit buffer 404. The transmit buffer is illustrated in more detail in FIG. 5. Referring to FIG. 5, the bits fill the systematic portion 504 of the transmit buffer 404 (of FIG. 4) row by row from left to right. The systematic portion 504 comprises k rows 508 of length L. In one embodiment, as shown in FIG. 5, the length L of the buffer coincides with the length of a radio frame without the overhead (e.g., CRC to help the inner decoder and the tail bits for the inner encoder). Referring back to FIG. 4, once the systematic portion 504 (of FIG. 5) is full, the outer block encoder 406 is activated to perform column-wise encoding of the bits in the systematic portion 504(1) (of FIG. 5) to generate (n–k) additional rows 510 (of FIG. 5) of parity bits. This column-wise operation is performed column by column for binary outer code, i.e., m=1. For non-binary code, i.e., m>1, every m adjacent columns in a row are treated as a m-bit symbol. The m-bit symbols along the top k rows are read by the outer encoder to produce n–k m-bit symbols that fill the corresponding lower n–k rows of these columns.

In another embodiment, the length L of the buffer is equal to the number of bits the inner coded frames carries divided by m, the dimension of the outer encoder code. In this embodiment, the first m rows from the TX buffer are sent in the first inner coded frame, the second m rows of bits are sent in the second inner-coded frame, until the entire buffer is transmitted. Referring back to FIG. 4, once the systematic portion 504 (of FIG. 5) is full, the outer block encoder 406 is activated to perform column-wise encoding of the bits in the systematic portion 504(1) (of FIG. 5) to generate m(n–k) additional rows 510 (of FIG. 5) of parity bits. This column-wise operation is performed column by column for binary outer code, i.e., m=1. For non-binary code, i.e., m>1, every m-rows of a column form a m-bit symbol. The k symbols from the top k m rows in the column are read by the outer encoder to produce (n–k) m-bit symbols that fill the corresponding lower m(n–k) rows of this column.

In one embodiment the outer encoder comprises a systematic Reed-Solomon (R-S). The content of the transmit buffer 404 is then provided to a physical layer 408. On the physical layer 408, the individual frames are encoded by an inner encoder (not shown), which results in encoded frames. The structure of the inner encoder may be, e.g., the structure of FIG. 3. The systematic rows and the parity rows of the buffer may be interlaced during transmission to reduce the chance of large number of systematic rows erased when the total number of inner code erasure exceeds the outer code's correcting capability. The frames are further processed in accordance with a selected modulation scheme. In one embodiment, the processing is performed in accordance with the IS-2000 standard. The processed frames are then transmitted over a communication channel 410.

The transmitted frames are received at the destination station and provided to a physical layer 412. On the physical layer 412, the individual frames are demodulated and provided to an inner decoder (not shown). In one embodiment, the inner decoder decodes each frame, and if the decoding is successful, outputs a correctly decoded frame; or if the decoding is unsuccessful, declares an erasure. The success or failure of decoding must be determined with a high accuracy. In one embodiment, this is achieved by including a long (for example, 16-bit) cyclic redundancy check (CRC) in the frame after outer encoding and before inner encoding. However, one of ordinary skills in the art recognizes that other mechanisms for frame quality indication may be used. The included CRC obtained from the decoded frame is compared with a CRC calculated from the bits of the decoded frame, and if the two CRCs are identical, the decoding is declared successful. Further processing at the physical layer proceeds in accordance with the result of the inner decoder decision.

The correctly decoded frames are provided to the appropriate rows of a of a receive buffer 414. If all the systematic k frames are correctly decoded by the inner decoder, the systematic frames from the systematic portion 414(1) of the receive buffer 414 are passed to upper layer (not shown) for further processing without outer decoding.

If the inner decoder cannot decode the frame, the decoder declares an erasure, and provides an outer block decoder 416 with an indication that the frame is missing. The process continues until there are as many parity frames received correctly and passed to a parity portion 414(2) of a receive buffer 414, as there are erased systematic frames. The receiver stops the reception of any remaining frames and the outer decoder 416 is activated to recover the erased systematic frames. The recovered systematic frames are passed to the upper layer.

If the total number of correctly received frames in the receive buffer 414 is less than k, in accordance with one embodiment the outer decoder is not activated since there is no guarantee that the decoding would be successful. The correctly received systematic frames together with identification of the missing bits are passed to the higher layers. In another embodiment, the receiver uses decoded bits from the inner decoder (which are unreliable as indicated by the failed CRC checks) to recover bits for the systematic bits. In accordance with one embodiment, the receiver decode the unreliable bits from the inner decoder and finds the most likely codeword. In the another embodiment, the receiver uses measurement of the signal quality of the erased frames in the buffer to choose enough erroneously received frames with the highest signal to noise ratio to form a sub buffer with k rows. The receiver then performs bit flipping (changing a bit value of 0 to a bit value 1 and vice versa at one column at a time) and checks whether the bit flipping resulted in a codeword. In one embodiment, the bit flipping is first performed on the least reliable bits and continues with bits in the order of the bits' increasing reliability. The reliability of a bit may be determined in accordance with inner decoding metrics, e.g., a signal to noise and interference ratio during the frame, like the Yamamoto metric, the re-encoded symbol error rate, re-encoded energy metric, and other metrics known to one of ordinary skills in the art, or the metrics' combinations. If a codeword was not found, the bit flipping continues through all the remaining columns for all the unreliable rows. If a codeword was not found, the bit flipping continues with increased number of bits flipped (that is, changing 2 bits at a time, then 3 bits, until the maximum number of bits), until either a codeword is found or all combinations are exhausted. In another embodiment, the CRC from the unreliable rows are used to check the overall success of the decoding in this situation. The frames are passed to the higher layers only if the CRC from all rows match; otherwise, only bits from reliable rows are passed to the higher layers.

To improve reliability of decoding, in another embodiment, the demodulation and inner decoding are performed for more than k correctly received frames in a buffer. In accordance in yet another embodiment the demodulation and inner decoding are performed for all frames in the buffer. In both embodiments, the outer decoding is performed on the k (or km) rows with the highest quality. The quality may be determined in accordance with inner decoding metrics, e.g., a signal to noise and interference ratio during the frame, like the Yamamoto metric, the re-encoded symbol error rate, re-encoded energy metric, and other metrics known to one of ordinary skills in the art, or the metrics' combinations. Use of quality metrics for quality estimation is disclosed in detail in U.S. Pat. No. 5,751,725 entitled "METHOD AND APPARATUS FOR DETERMINING THE RATE OF RECEIVED DATA IN A VARIABLE RATE COMMUNICATIONS SYSTEM" and U.S. Pat. No. 5,774,496 entitled "METHOD AND APPARATUS FOR DETERMINING DATA RATE OF TRANSMITTED VARIABLE RATE DATA IN A COMMUNICATIONS RECEIVER" and both are assigned to the assignee of the present invention.

Battery Power Savings

An important requirement for a subscriber station is low battery power consumption. The above-described encoding method ensures that less than n correctly received frames are sufficient for decoding the systematic information per one transmitting buffer. Consequently, it is not necessary for the subscriber station to receive all n frames to decode the transmitted information. If the subscriber station determines the amount of redundancy, for example from an encoding rate of the frames, the subscriber station may determine a number of frames that must be received correctly, i.e., be declared correctly decoded by the inner decoder for the outer decoder to decode correctly. The subscriber station may determine the encoding rate by several methods known to one of ordinary skills in the art. Thus, for example, there can be only one fixed encoding rate. If more than one rate is used, the subscriber station can use a blind rate determination, or the possible data rates are provided to the subscriber station by the origination station. Furthermore, the information about the amount of redundancy may be provided to the subscriber station.

Once the subscriber station accumulates the determined number of frames correctly decoded by the inner decoder into the receive buffer 414 (both the systematic portion 414(1) and the parity portion 414(2)), the subscriber station may terminate reception and inner decoding of additional frames. Therefore, a battery power savings is accomplished. Because the subscriber station knows a number of frames in the transmit buffer 404 and the number of frames it received, the subscriber station may determine time when the subscriber station needs to start reception and inner decoding of the frames comprising new systematic information.

Because the HSBS is provided in addition to traditional communication system services, e.g., voice, short message system, data, and other services known to one of ordinary skills in the art, the subscriber station is required to be able to receive such traditional services while engaged in an HSBS. Thus, the subscriber station needs to be able to receive signaling messages. The signaling in broadcast services is disclosed in detail in a co-pending application Ser. No. 09/933, 978, entitled "METHOD AND APPARATUS FOR SIGNALING IN BROADCAST COMMUNICATION SYSTEM," filed Aug. 20, 2001, and assigned to the assignee of the present invention. The signaling activities include, e.g., paging message reception, answer to paging message, overhead messages containing the system configuration reception, search for the neighboring systems on the same or different frequencies, and other signaling known to one of ordinary skills in the art. As discussed above, the subscriber station may discontinue reception activities after accumulating enough frames in the buffer, thus may miss signaling information.

Consequently, in one embodiment, the signaling activities the subscriber station receiving the broadcast channel has to perform are carried out during the most likely time the subscriber station is receiving the broadcast channel. The most likely time the subscriber station receiving the broadcast channel is usually when the portion of the buffer where systematic rows are transmitted over the air. Alternatively, a subscriber station is obligated to received the broadcast channel at a pre-defined time. Therefore, the subscriber station must ascertain that the subscriber station does not terminate reception of the frames before the time, during which the subscriber station is obligated to receive the broadcast channel.

Hard Handoff on a Common Broadcast Forward Link

To enhance the Common Broadcast Forward Link performance, soft and softer handoffs are desirable in overlapped coverage areas of different sectors. The method and system for providing a communication with a subscriber station through more than one base station during the soft hand-off process are disclosed in U.S. Pat. No. 6,731,936 entitled "METHOD AND SYSTEM FOR A HANDOFF IN A BROADCAST COMMUNICATION SYSTEM," issued May 4, 2004, and assigned to the assignee of the present invention.

Figure 6:
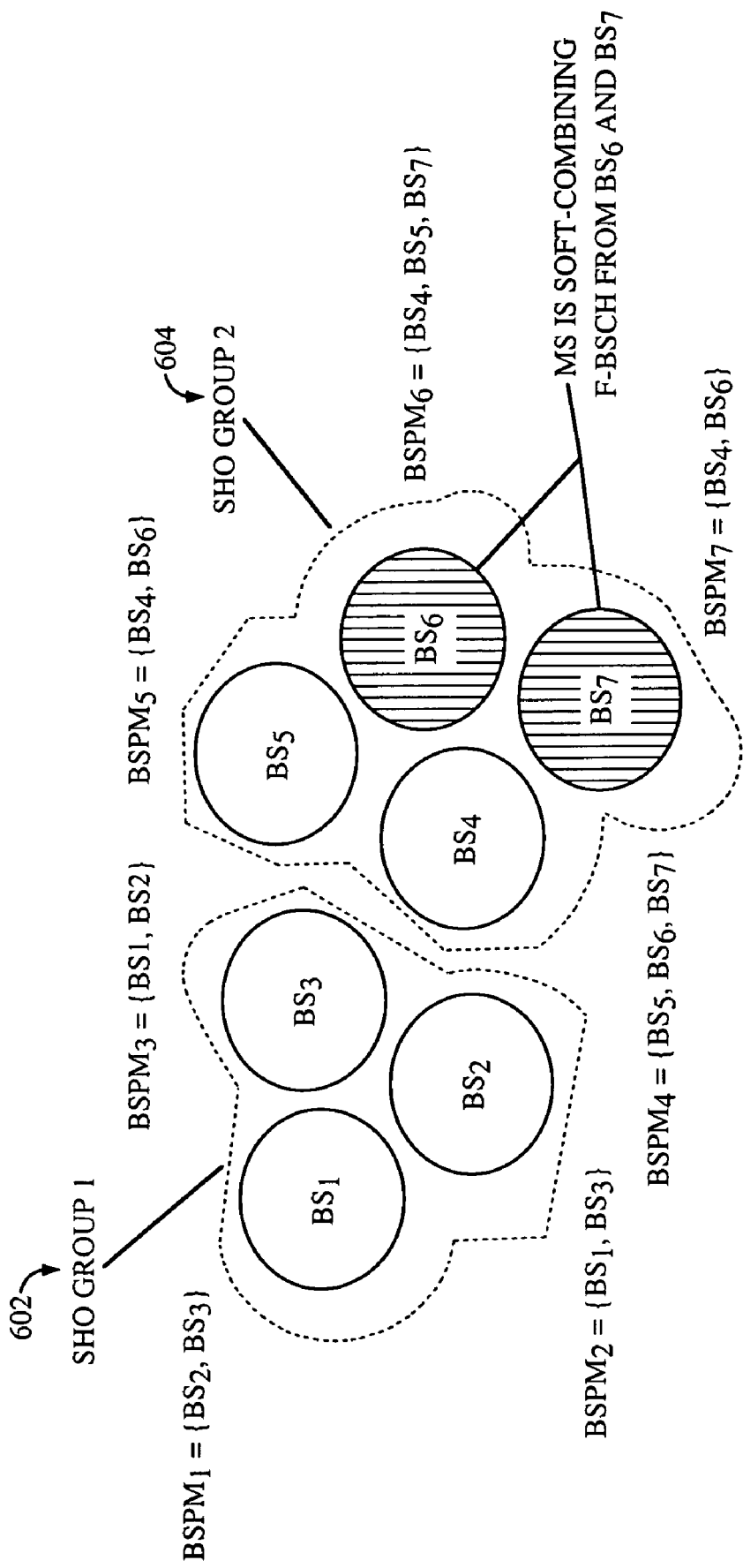
FIG. 6 illustrates concept of soft-handoff groups in a broadcast communication system.

Although the described soft and softer handoff method is desirable because the subscriber station does not experience a discontinuity in transmitted information, such methods cannot be always utilized in a broadcast communication system. A subscriber station may soft combine only synchronous transmissions; consequently, the subscriber station may perform a soft and softer handoff only between base stations that belong to the same soft handoff (SHO) group. As used herein a SHO group means a group of all Base Stations transmitting the Common Broadcast Forward Link simultaneously and synchronously. FIG. 6 illustrates two SHOs, one comprising $BS_1$, $BS_2$, and $BS_3$, the other comprises $BS_4$, $BS_5$, $BS_6$, and $BS_7$. Consequently, if the subscriber station crosses boundaries from a coverage area of SHO Group 1 602 to a coverage area of SHO Group 2 604, a hard handoff is required.

The use of the above-described encoding method increases the probability that the subscriber station either does not experience a discontinuity in transmitted information or minimize such discontinuity if the discontinuity occurs.

Figure 7:
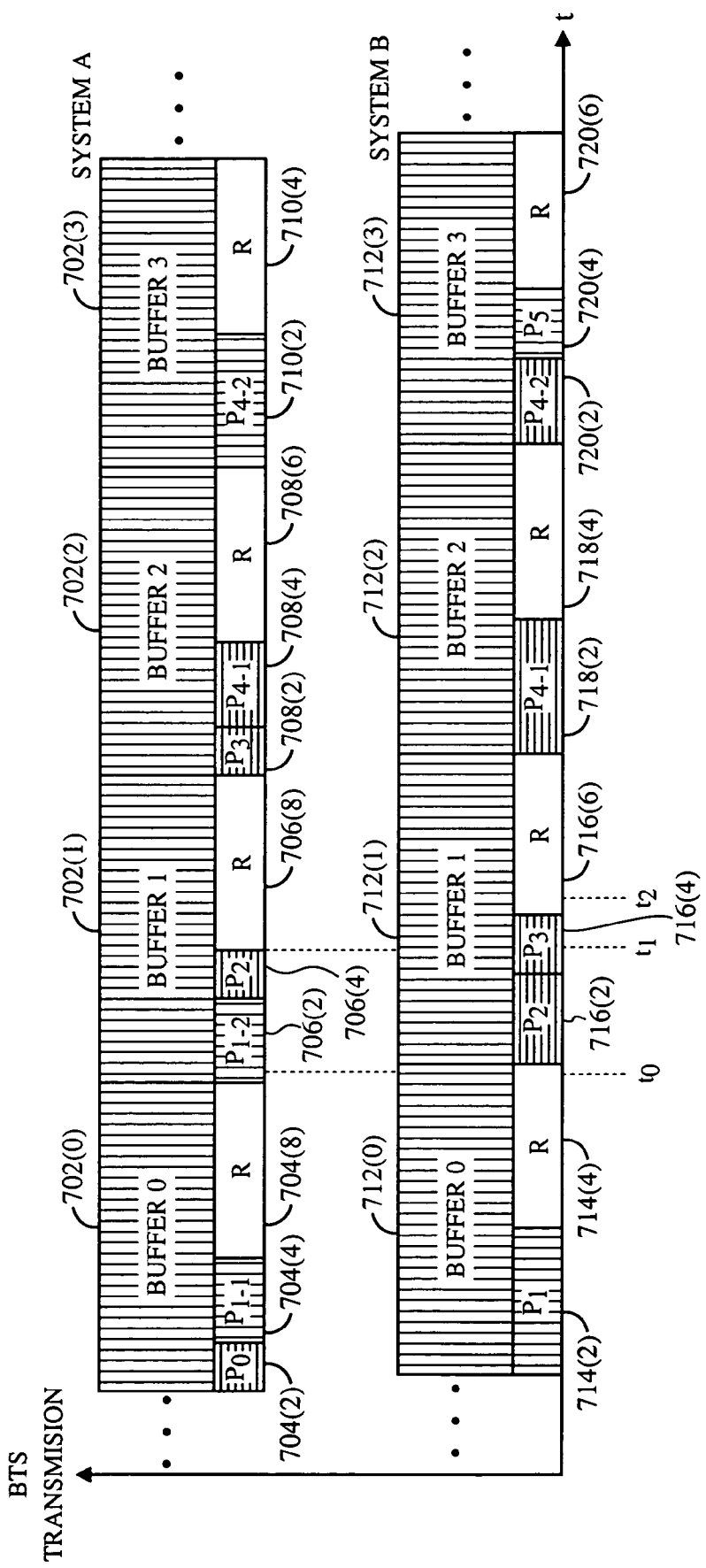
FIG. 7 illustrates timing diagram for hard handoff.

FIG. 7 illustrates unsynchronized transmission between SHO Group 1 602 and SHO Group 2 604 (from FIG. 6), where the transmission from the Base Stations of SHO Group 1 602 is delayed relative to the transmission from the Base Stations of SHO Group 2 604. The subscriber station (not shown) is monitoring transmission from a base station of SHO Group 1 602. At time $t_0$ the subscriber station determines that hard handoff to a different SHO Group is indicated. The handoff is indicated, e.g., when a quality metric of received transmission falls below a threshold. The subscriber station then determines whether a soft handoff is possible. In accordance with one embodiment, the subscriber station determines a configuration of neighbor sectors in accordance with a value of an HSBS neighbor configuration indicator (NGHBR_CONFIG_HSBS) transmitted by the current base station. Such a method is described in detail in the above-cited U.S. Pat. No. 6,731,936 entitled "METHOD AND SYSTEM FOR A HANDOFF IN A BROADCAST COMMUNICATION SYSTEM," issued May 4, 2004, and assigned to the assignee of the present invention. The subscriber station continues to accumulate frames of Buffer 1 702(1) until time $t_1$, when the subscriber station has accumulated enough good frames in Buffer 1 702(1) for decoding. This includes packets $P_0$ 704(2), $P_1$ (which was transmitted in part $P_{1-1}$ 704(4) in Buffer 0 702(0) and part $P_{1-2}$ 706(2) in Buffer 1 702(1)), and $P_2$ 706(4). The symbol P denotes a systematic part of a buffer; the symbol R denotes the redundant part. The subscriber station initiates hard handoff and acquires transmission a base station of SHO Group 2 604 in time $t_2$. The interval $\Delta t = t_2 - t_1$ depends on the type of handoff the subscriber station performs, e.g., inter-frequency hard handoff, same frequency handoff, design of the subscriber station and base station, and other criteria known to one of ordinary skills in the art. Different methods of performing handoff are discussed in the above-cited U.S. Pat. No. 6,731,936 entitled "METHOD AND SYSTEM FOR A HANDOFF IN A BROADCAST COMMUNICATION SYSTEM," issued May 4, 2004 and assigned to the assignee of the present invention. Thus at time $t_2$ the subscriber station begins receiving frames 712 transmitted by a base station of SHO Group 2 604. Because of the correcting capability of the encoding in accordance with an embodiment of this invention, the received frames may be enough to correctly decode packets $P_2$ 716(2), $P_3$ 716(4) of Buffer 1 716(4). The subscriber station discards any duplicate packets. One of ordinary skills in the art recognizes that the above-disclosed principles apply in the scenario, in which the transmission from the base stations of SHO Group 1 602 is advanced relative to the transmission from the base stations of SHO Group 2 604.

Inter-frequency Hard Handoff

If a subscriber station travels outside the boundary of the communication system, with which it is currently communicating, it is desirable to maintain the communication link by transferring the call to a neighboring system, if one exists. The neighboring system may use any wireless technology, examples of which are CDMA, NAMPS, AMPS, TDMA or FDMA. If the neighboring system uses CDMA on the same frequency band as the current system, an inter-system soft handoff can be performed. In situations where inter-system soft handoff is not available, the communication link is transferred through a hard handoff where the current connection is broken before a new one is made. Examples of typical hard handoff situations include: (1) the situation in which a subscriber station is traveling from region serviced by a CDMA system to a region serviced by a system employing an alternate technology and (2) the situation in which a call is transferred between two CDMA systems which use different frequency bands (inter-frequency hard handoff).

Inter-frequency hard handoffs can also occur between base stations of the same CDMA system. For example, a region of high demand such as a downtown area may require a greater number of frequencies to service demand than the suburban region surrounding it. It may not be cost effective to deploy all available frequencies throughout the system. A call originating on a frequency deployed only in the high congestion area must be handed off as the user travels to a less congested area. Another example is that of a microwave or other service operating on a frequency within the system's boundaries. As users travel into an area suffering from interference from the other service, their call may need to be handed off to a different frequency.

A method for performing hard handoff attempt with greater probability of success is disclosed in the U.S. Pat. No. 5,999,816, entitled "METHOD AND APPARATUS FOR PERFORMING MOBILE ASSISTED HARD HANDOFF BETWEEN COMMUNICATION SYSTEMS", assigned to the assignee of the present invention. In the U.S. Pat. No. 5,999,816, subscriber stations tune temporarily to the frequency of the hard handoff destination system and search for available pilot signals on that frequency, for inclusion of the associated base stations in the active set. If the search is successful, and at least one of the associated base stations satisfies the criteria to be included in the active set, the subscriber station acquires the base station. In the event that the hard handoff attempt is unsuccessful, the subscriber station return to the original system with information, which the original system uses to assist in the performance of future handoff attempts. Alternatively, with no handoff attempt made, the subscriber station searches the destination system. After the searching task is completed, the subscriber station will retune to the original frequency to resume current communications. While tuned to an alternate frequency, any frames of data generated by the subscriber station or transmitted by the base station will be corrupted. Typically, the base station will provide only a subset of the possible offsets for the subscriber station to search. Even so, the duration of the handoff attempt or search can be so long as to potentially corrupt a number of frames of data.

Consequently, an improved method for performing hard handoff attempt with greater probability of success is disclosed in the U.S. Pat. No. 6,134,440 entitled "METHOD AND APPARATUS FOR PERFORMING MOBILE STATION ASSISTED HARD HANDOFF USING OFF LINE SEARCHING", and assigned to the assignee of the present invention. In the U.S. Pat. No. 6,134,440, after having been directed to search for pilot signals in an alternate frequency band, the subscriber station tunes to that alternate frequency and samples the incoming data, storing those samples in memory. During the time that the subscriber station is tuned to the alternate frequency, all data being transmitted to the subscriber station on the forward link is lost. Similarly, any reverse link data transmitted by the subscriber station would be transmitted on the alternate frequency. Therefore, such reverse link data would not be received at the origination base station. When a sufficient number of samples have been stored, the subscriber station retunes to the origination frequency. At this time, the forward link data is again received by the subscriber station, and reverse link data can be successfully transmitted to the origination base station. After retuning to the origination frequency, a searcher in the subscriber station will subsequently be employed to search for pilot signal offsets utilizing the stored data collected from the alternate frequency. In accordance with the present invention, due to the relatively short period of time required to sample and store information on the alternative frequency, the active communication link is not broken. Neither is the active communication link affected by the subsequent off-line search. Because less time is required to sample the data on the alternate frequency than is required to actively search for pilot signals in real time, and because the communication link is corrupted by the hard handoff process only while the subscriber station is tuned to the alternate frequency, the interruption the forward and reverse links on the originating system are minimized. In fact, the error correction coding employed in modern communication systems may eliminate all errors introduced by sampling the alternate frequency, if the sampling time is small enough.

Using the above-described encoding method improves the searching method disclosed in both above-described co-applications. Because the subscriber station does not need to accumulate all n frames from the transmitter buffer 404, for recovering all the systematic information, once the subscriber station accumulates the determined number of frames correctly decoded by the inner decoder into the receive buffer 414 of FIG. 4 (both the systematic portion 414(1) and the parity portion 414(2)), the subscriber station may terminate reception of additional frames. Because the subscriber station knows a number of frames in the transmit buffer 404 and the number of frames it received, the subscriber station may determine time when it needs to start reception and inner decoding of frames comprising new systematic information. The subscriber station then may use the time between terminating the reception of additional frames and the time of restarting reception and inner decoding of frames to perform handoff/search in accordance to the concepts disclosed in the U.S. Pat. Nos. 5,999,816 and 6,134,440.

Consequently, once the subscriber station accumulates the determined number of frames correctly decoded by the inner decoder and the time when the subscriber station needs to start reception and inner decoding, the subscriber station terminates reception of additional frames. The subscriber station then tunes to a frequency of the destination system. The information pertaining to the destination system may be obtained, e.g., from the origination system. If the subscriber station tuned to the destination system to perform a handoff, the subscriber station attempts to acquire at least one sector of the destination system. If at least one sector of the destination system is acquired as measured e.g., by a minimum pilot signal strength of the at least one sector of the destination system, the handoff is deemed to be successful and the subscriber station remains on the destination system and begins to receive a service on a channel from the acquired sector. Otherwise, the subscriber station begins receiving signals at the frequency of the destination system and storing the signals. The subscriber station performs the storing for a time required or until the time the subscriber station needs to retune back to the sector in the origination system. The subscriber station then concurrently receives frames and analyzes the stored signals to identify sector(s) in a destination system to handoff. The subscriber station then may repeat the described method or to handoff to sector(s) identified by the analysis.

One of ordinary skills in the art recognizes, that the embodiments of the present invention are equally applicable to a hard handoff on a common broadcast channel and handoff on a traffic channel, as long as the encoding-decoding of the present invention is utilized by the particular channel.

Paging

As illustrated in FIG. 6, all subscriber stations in an SHO Group are either monitoring the common broadcast forward link, engaged in a communication with other subscriber stations, or monitoring a paging channel The paging channel, which the subscriber station are monitoring, is known to the communication system. The paging channel is assigned to the subscribers monitoring the paging channel and engaged in a communication with other subscriber stations in accordance with methods utilized by current communications systems, e.g., IS-2000, WCDMA, UMTS. Additionally/alternatively, the paging channel to the subscribers is assigned in accordance with methods disclosed in U.S. Pat. No. 6,731,936 entitled "METHOD AND SYSTEM FOR A HANDOFF IN A BROADCAST COMMUNICATION SYSTEM," issued May 4, 2004, and assigned to the assignee of the present invention. Consequently, it is possible to page any subscriber.

In accordance with one, the common broadcast channel is utilized for paging the subscriber station monitoring the common broadcast forward link. As explained in reference to FIG. 4, HSBS channels, organized into packets, are multiplexed on the F-BSCH. Therefore, a subscriber station receiving an HSBS channel must be able to discern packets carrying signaling messages, e.g., a paging message from packets carrying the HSBS channel content. In accordance with one embodiment, a BSR_ID of certain value, e.g., '000' may be reserved to indicate that the content of a packet or packets carry signaling (paging) information. A disadvantage of this approach is that because the content of the packet or packets is synchronized in an SHO group, all subscriber stations in the SHO group receive the same paging information, whether it is meant for them or not. Because the payload per packet is finite, it may take several packets carrying paging information to page all subscribers in the SHO group. This results in delay of the HSBS channel content, which may be undesirable in certain applications.

Consequently, in accordance with another embodiment, a content of a packet or packets of an HSBS channel transmitted by the sectors in an SHO group is unsynchronized in pre-defined periodic intervals. Consequently, the content of the packet or packets can be different in each sector, therefore, allowing paging subscriber stations on a per sector basis. Because the periodic intervals are predefined, the subscriber stations know that the packet or packets transmitted in that interval carry signaling information.

Referring back to FIG. 5, in accordance with one embodiment, several pre-determined rows in the parity portion 506 of the transmitting buffer 502 are replaced with the paging information. When a subscriber station encounters a packet that the subscriber station knows carries paging information, the subscriber station interprets the pre-determined rows as signaling information. Because several pre-determined rows in the parity portion 506 were replaced, the information bits are unprotected, and may be erased. However, because the paging information is carried in a few packets, the base station may increase power for the time during which the packets carrying both signaling information and HSBS content are transmitted to compensate for the loss of protection due to encoding.

Alternatively, the outer encoder can encode the information rows with lesser redundancy for packet carrying both HSBS content and paging information than the redundancy for packets carrying HSBS content information. Therefore, less than (n−k) rows of the parity portion 506 of the transmitting buffer 502 are filled with the parity information. The rows unused by the parity bits may be used for the paging information. Although the protection of the packet carrying both HSBS content and paging information is less than of the packet carrying HSBS content information, the encoding rate may be designed to be satisfactory under normal channel conditions. Furthermore, the base station may increase power for the time during which the packets carrying both signaling information and HSBS content are transmitted to compensate for the loss of protection due to lesser encoding.

In accordance with another embodiment, there is no need to pre-define periodic intervals for the transmission of paging information. A packet carrying HSBS content information is encoded with one encoding rate and a packet carrying paging information is encoded with another rate. The subscriber station attempts to decode a received packet in accordance with a first rate hypothesis. If the decoding is successful, the packet is processed in accordance with the relationship between the rate hypothesis and the packet content. If the decoding is unsuccessful, the subscriber station attempts to decode the received packet in accordance with a second rate hypothesis. If the decoding is successful, the packet is processed in accordance with the relationship between the rate hypothesis and packet content. Otherwise, an erasure is declared.

One skilled in the art will appreciate that although the flowchart diagrams are drawn in sequential order for comprehension, certain steps can be carried out in parallel in an actual implementation. Furthermore, unless indicate otherwise, method steps can me interchanged without departing form the scope of the invention.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

What is claimed is:

1. A method for reducing power consumption of a subscriber station, comprising:
    determining a number of frames that must be received and decoded correctly by an inner decoder for an outer decoder to correctly decode the received frames; and
    terminating reception of the frames when said determined number of frames was received correctly.

2. The method as claimed in claim 1 wherein said determining a number of frames that must be received correctly comprises:
    determining an amount of redundancy; and
    determining the number of frames that must be received correctly in accordance with said determined amount of redundancy.

3. The method as claimed in claim 2 wherein said determining an amount of redundancy comprises:
    providing the amount of redundancy independently of the received frames.

4. The method as claimed in claim 2 wherein said determining an amount of redundancy comprises:
    determining an encoding rate of received frames; and
    determining the amount of redundancy in accordance with the encoding rate.

5. The method as claimed in claim 2 wherein said determining the number of frames that must be received correctly in accordance with said determined amount of redundancy comprises:
    determining a minimum number of frames that must be received correctly.

6. The method as claimed in claim 5, further comprising:
increasing said determined minimum number of frames that must be received correctly by a first number.

7. The method as claimed in claim 4 wherein said determining an encoding rate of received frames comprises:
determining an encoding rate of received frames in accordance with the received frames.

8. The method as claimed in claim 4 wherein said determining an encoding rate of received frames comprises:
providing an encoding rate of received frames independently of the received frames.

9. The method as claimed in claim 1 wherein said terminating reception of the frames when said determined number of frames was received correctly comprises:
terminating reception of the frames when said determined number of frames was received correctly and a time during which the subscriber station is obligated to receive the frames expired.

10. A method for performing hard handoff on a common broadcast channel comprising:
receiving at a subscriber station frames transmitted on the common broadcast channel from a first sector;
determining at the subscriber station a need for handoff;
identifying at the subscriber station at least one sector belonging to a soft handoff group different from a soft handoff group including the first sector;
determining a number of frames from a current buffer that must be received correctly;
terminating reception of the frames when said determined number of frames were received correctly; and
beginning reception of frames from the identified at least one sector.

11. The method as claimed in claim 10 wherein said determining a number of frames that must be received correctly comprises:
determining an amount of redundancy; and
determine said number of frames that must be received correctly in accordance with said determined amount of redundancy.

12. The method as claimed in claim 11 wherein said determining an amount of redundancy comprises:
providing the amount of redundancy independently of the received frames.

13. The method as claimed in claim 11 wherein said determining an amount of redundancy comprises:
determining an encoding rate of received frames; and
determining the amount of redundancy in accordance with the encoding rate.

14. The method as claimed in claim 10 wherein said determining said number of frames that must be received correctly in accordance with a determined amount of redundancy comprises:
determining a minimum number of frames that must be received correctly.

15. The method as claimed in claim 14, further comprising:
increasing said determining minimum number of frames that must be received correctly by a first number.

16. The method as claimed in claim 13 wherein said determining an encoding rate of received frames comprises:
determining an encoding rate of received frames in accordance with the received frames.

17. The method as claimed in claim 13 wherein said determining an encoding rate of received frames comprises:
providing an encoding rate of received frames independently of the received frames.

18. The method as claimed in claim 10 wherein said terminating reception of the frames when said determined number of frames were received correctly comprises:
terminating reception of the frames when said determined number of frames were received correctly and a time during which the subscriber station is obligated to receive the frames expired.

19. The method as claimed in claim 10, further comprising:
determining whether at least some decoded packets received from the at least one sector are identical to at least some decoded packets received from the first sector; and
discarding the identical packets.

20. A method for a handoff from an area covered by an origination system into an area covered by a destination system comprising:
receiving at a subscriber station service on a channel from a sector in the origination system;
determining at the subscriber station a need for handoff;
identifying at the subscriber station a destination system;
determining a number of frames from a current buffer that must be received correctly;
terminating reception of the frames when said determined number of frames were received correctly;
tuning to a frequency of the destination system; and
receiving service on a channel from at least one sector if the at least one sector of the destination system is acquired at the subscriber station.

21. The method as claimed in claim 20, further comprising:
determining a time to restart receiving at a subscriber station service on the channel from the sector in the origination system.

22. The method as claimed in claim 20, further comprising:
storing signals received at the frequency of the destination system;
retuning to the frequency of the origination system;
at the subscriber station concurrently:
receiving service on the channel from the sector in the origination system; and
analyzing the stored signals to identify a sector in a destination system that can provide service;
if no sector of the destination system is acquired at the subscriber station.

23. The method as claimed in claim 22 wherein said retuning to the origination frequency of the origination system comprises:
retuning to the origination frequency before the time to restart receiving service on a channel from a sector in the origination system.

24. The method as claimed in claim 22, further comprising:
performing hard handoff if the sector in a destination system is identified.

25. An apparatus for reducing power consumption of a subscriber station, comprising:
a processor; and
a storage medium communicatively coupled to said processor and comprising a set of instructions executable by said processor to:
determine a number of frames that must be received and decoded correctly by an inner decoder for an outer decoder to correctly decode the received frames; and
cause termination of reception of the frames when said determined number of frames was received correctly.

26. The apparatus as claimed in claim 25 wherein said processor is configured to determine a number of frames that must be received correctly by executing a set of instructions to:
  determine an amount of redundancy; and
  determine the number of frames that must be received correctly in accordance with said determined amount of redundancy.

27. The apparatus as claimed in claim 26 wherein said processor is configured to determine an amount of redundancy by executing a set of instructions to:
  determine the amount of redundancy independently of the received frames.

28. The apparatus as claimed in claim 26 wherein said processor is configured to determine an amount of redundancy by executing a set of instructions to:
  determine an encoding rate of received frames; and
  determine the amount of redundancy in accordance with the encoding rate.

29. The apparatus as claimed in claim 26 wherein said processor is configured to determine the number of frames that must be received correctly in accordance with said determined amount of redundancy by executing a set of instructions to:
  determine a minimum number of frames that must be received correctly.

30. The apparatus as claimed in claim 29 wherein said processor is further configured to execute a set of instructions to:
  increase said determined minimum number of frames that must be received correctly by a first number.

31. The apparatus as claimed in claim 28 wherein said processor is configured to determine an encoding rate of received frames by executing a set of instructions to:
  determine an encoding rate of received frames in accordance with the received frames.

32. The apparatus as claimed in claim 28 wherein said processor is configured to determine an encoding rate of received frames by executing a set of instructions to:
  determine an encoding rate of received frames independently of the received frames.

33. The apparatus as claimed in claim 25 wherein said processor is configured to cause termination of reception of the frames when said determined number of frames was received correctly by executing a set of instructions to:
  cause termination of reception of the frames when said determined number of frames was received correctly and a time during which the subscriber station is obligated to receive the frames expired.

34. An apparatus for performing hard handoff on a common broadcast channel comprising:
  a processor; and
  a storage medium communicatively coupled to said processor and comprising a set of instructions executable by said processor to:
  cause a subscriber station to receive frames transmitted on a common broadcast channel from a first sector;
  determine a need for handoff;
  identify at least one sector belonging to a soft handoff group different from a soft handoff group including the first sector;
  determine a number of frames from a current buffer that must be received correctly;
  cause the subscriber station to terminate reception of the frames when said determined number of frames was received correctly; and
  cause the subscriber station to begin reception of frames from the identified at least one sector.

35. The apparatus as claimed in claim 34 wherein said processor is configured to determine a number of frames that must be received correctly by executing a set of instructions to:
  determine an amount of redundancy; and
  determine the number of frames that must be received correctly in accordance with said determined amount of redundancy.

36. The apparatus as claimed in claim 35 wherein said processor is configured to determine an amount of redundancy by executing a set of instructions to:
  determine the amount of redundancy independently of the received frames.

37. The apparatus as claimed in claim 35 wherein said processor is configured to determine an amount of redundancy by executing a set of instructions to:
  determine an encoding rate of received frames; and
  determine the amount of redundancy in accordance with the encoding rate.

38. The apparatus as claimed in claim 35 wherein said processor is configured to determine the number of frames that must be received correctly in accordance with said determined amount of redundancy by executing a set of instructions to:
  determine a minimum number of frames that must be received correctly.

39. The apparatus as claimed in claim 38 wherein said processor is further configured to execute a set of instructions to:
  increase said determined minimum number of frames that must be received correctly by a first number.

40. The apparatus as claimed in claim 37 wherein said processor is configured to determine an encoding rate of received frames by executing a set of instructions to:
  determine an encoding rate of received frames in accordance with the received frames.

41. The apparatus as claimed in claim 37 wherein said processor is configured to determine an encoding rate of received frames by executing a set of instructions to:
  determine an encoding rate of received frames independently of the received frames.

42. The apparatus as claimed in claim 34 wherein said processor is configured to cause the subscriber station to terminate reception of the frames when said determined number of frames were received correctly by executing a set of instructions to:
  cause the subscriber station to terminate reception of the frames when said determined number of frames were received correctly and a time during which the subscriber station is obligated to receive the frames expired.

43. The apparatus as claimed in claim 34 wherein said processor is further configured to execute a set of instructions to:
  determine whether at least some decoded packets received from the at least one sector are identical to at least some decoded packets received from the first sector; and
  discard the identical packets.

44. An apparatus for a handoff from an area covered by an origination system into an area covered by a destination system comprising:
  a processor; and
  a storage medium communicatively coupled to said processor and comprising a set of instructions executable by said processor to:
  cause a subscriber station to receive service on a channel from a sector in the origination system;
  determine a need for handoff;

identify a destination system;
determine a number of frames from a current buffer that must be received correctly;
cause the subscriber station to terminate reception of the frames when said determined number of frames were received correctly;
cause the subscriber station to tune to a frequency of the destination system; and
cause the subscriber station to receive service on a channel from at least one sector if the at least one sector of the destination system is acquired at the subscriber station.

45. The apparatus as claimed in claim 44 wherein said processor is further configured to execute a set of instructions to:
determine a time to cause the subscriber station to restart receiving service on the channel from the sector in the origination system.

46. The apparatus as claimed in claim 44 wherein said processor is further configured to execute a set of instructions to:
store signals received at the frequency of the destination system;
cause the subscriber station to retune to a frequency of the origination system and receive service on the channel from the sector in the origination system; and
analyze the stored signals to identify a sector in a destination system that can provide service;
if no sector of the destination system is acquired at the subscriber station.

47. The apparatus as claimed in claim 46 wherein said processor is configured to cause the subscriber station to retune to a frequency of the origination system and receive service on the channel from the sector in the origination system by executing a set of instructions to:
cause the subscriber station to retune to the frequency of the origination system before the time to restart receiving service on a channel from a sector in the origination system.

48. The apparatus as claimed in claim 46 wherein said processor is further configured to execute a set of instructions to:
cause the subscriber station to perform hard handoff if the sector in a destination system is identified.

49. An apparatus for reducing power consumption of a subscriber station, comprising:
means for determining a number of frames that must be received and decoded correctly by an inner decoder for an outer decoder to correctly decode the received frames; and
means for terminating reception of the frames when said determined number of frames was received correctly.

50. The apparatus as claimed in claim 49 wherein said means for determining a number of frames that must be received correctly comprises:
means for determining an amount of redundancy; and
means for determining the number of frames that must be received correctly in accordance with said determined amount of redundancy.

51. The apparatus as claimed in claim 49 wherein said means for terminating reception of the frames when said determined number of frames was received correctly comprises:
means for terminating reception of the frames when said determined number of frames was received correctly and a time during which the subscriber station is obligated to receive the frames expired.

52. The apparatus as claimed in claim 50 wherein said means for determining an amount of redundancy comprises:
means for providing the amount of redundancy independently of the received frames.

53. The apparatus as claimed in claim 50 wherein said means for determining an amount of redundancy comprises:
means for determining an encoding rate of received frames; and
means for determining the amount of redundancy in accordance with the encoding rate.

54. The apparatus as claimed in claim 50 wherein said means for determining the number of frames that must be received correctly in accordance with said determined amount of redundancy comprises:
means for determining a minimum number of frames that must be received correctly.

55. The apparatus as claimed in claim 53 wherein said means for determining an encoding rate of received frames comprises:
means for determining an encoding rate of received frames in accordance with the received frames.

56. The apparatus as claimed in claim 53 wherein said means for determining an encoding rate of received frames comprises:
means for providing an encoding rate of received frames independently of the received frames.

57. The apparatus as claimed in claim 54, further comprising:
means for increasing said determined minimum number of frames that must be received correctly by a first number.

58. An apparatus for performing hard handoff on a common broadcast channel comprising:
means for receiving at a subscriber station frames transmitted on the common broadcast channel from a first sector;
means for determining at the subscriber station a need for handoff;
means for identifying at the subscriber station at least one sector belonging to a soft handoff group different from a soft handoff group including the first sector;
means for determining a number of frames from a current buffer that must be received correctly;
means for terminating reception of the frames when said determined number of frames were received correctly; and
means for beginning reception of frames from the identified at least one sector.

59. The apparatus as claimed in claim 58 wherein said means for determining a number of frames that must be received correctly comprises:
means for determining an amount of redundancy; and
means for determining number of frames that must be received correctly in accordance with said determined amount of redundancy.

60. The apparatus as claimed in claim 58 wherein said means for determining a number of frames that must be received correctly in accordance with a determined amount of redundancy comprises:
means for determining a minimum number of frames that must be received correctly.

61. The apparatus as claimed in claim 58 wherein said terminating reception of the frames when said determined number of frames were received correctly comprises:
terminating reception of the frames when said determined number of frames were received correctly and a time during which the subscriber station is obligated to receive the frames expired.

62. The apparatus as claimed in claim 58, further comprising:
   means for determining whether at least some decoded packets received from the at least one sector are identical to at least some decoded packets received from the first sector; and
   means for discarding the identical packets.

63. The apparatus as claimed in claim 59 wherein said means for determining an amount of redundancy comprises:
   means for providing the amount of redundancy independently of the received frames.

64. The apparatus as claimed in claim 59 wherein said means for determining an amount of redundancy comprises:
   means for determining an encoding rate of received frames; and
   means for determining the amount of redundancy in accordance with the encoding rate.

65. The apparatus as claimed in claim 60, further comprising:
   means for increasing said determining minimum number of frames that must be received correctly by a first number.

66. The apparatus as claimed in claim 64 wherein said means for determining an encoding rate of received frames comprises:
   means for determining an encoding rate of received frames in accordance with the received frames.

67. The apparatus as claimed in claim 64 wherein said means for determining an encoding rate of received frames comprises:
   providing an encoding rate of received frames independently of the received frames.

68. An apparatus for a handoff from an area covered by an origination system into an area covered by a destination system comprising:
   means for receiving at a subscriber station service on a channel from a sector in the origination system;
   means for determining at the subscriber station a need for handoff;
   means for identifying at the subscriber station a destination system;
   means for determining a number of frames from a current buffer that must be received correctly;
   means for terminating reception of the frames when said determined number of frames were received correctly;
   means for tuning to a frequency of the destination system; and
   means for receiving service on a channel from at least one sector if the at least one sector of the destination system is acquired at the subscriber station.

69. The apparatus as claimed in claim 68, further comprising:
   means for determining a time to restart receiving at a subscriber station service on the channel from the sector in the origination system.

70. The apparatus as claimed in claim 68, further comprising:
   means for storing signals received at the frequency of the destination system;
   means for retuning to the frequency of the origination system;
   at the subscriber station concurrently:
      means for receiving service on the channel from the sector in the origination system; and
      means for analyzing the stored signals to identify a sector in a destination system that can provide service;
      if no sector of the destination system is acquired at the subscriber station.

71. The apparatus as claimed in claim 70 wherein said means for retuning to the origination frequency of the origination system comprises:
   means for retuning to the origination frequency before the time to restart receiving service on a channel from a sector in the origination system.

72. The apparatus as claimed in claim 70, further comprising:
   means for performing hard handoff if the sector in a destination system is identified.

* * * * *